`US010438654B2`

United States Patent
Li et al.

(10) Patent No.: US 10,438,654 B2
(45) Date of Patent: Oct. 8, 2019

(54) TRANSPOSE STATIC RANDOM ACCESS MEMORY (SRAM) BIT CELLS CONFIGURED FOR HORIZONTAL AND VERTICAL READ OPERATIONS

(71) Applicant: QUALCOMM Incorporated, San Diego, CA (US)

(72) Inventors: Xia Li, San Diego, CA (US); Yandong Gao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/712,257

(22) Filed: Sep. 22, 2017

(65) Prior Publication Data
US 2019/0096475 A1      Mar. 28, 2019

(51) Int. Cl.
*G11C 11/419*      (2006.01)
*H01L 27/11*       (2006.01)
(Continued)

(52) U.S. Cl.
CPC .......... *G11C 11/419* (2013.01); *G11C 7/1006* (2013.01); *G11C 8/16* (2013.01);
(Continued)

(58) Field of Classification Search
CPC ... G11C 11/412; G11C 11/419; G11C 7/1006; G11C 8/16; H01L 23/528; H01L 27/1104
(Continued)

(56) References Cited

U.S. PATENT DOCUMENTS 5,734,613 A  *  3/1998  Gibson  ............... G11C 8/16
                                                365/189.04
5,973,985 A  *  10/1999  Ferrant  ............... G11C 8/16
                                                365/154
(Continued)

FOREIGN PATENT DOCUMENTS

EP      2482285 B1      7/2014

OTHER PUBLICATIONS

Bong, Kyeongryeol, et al., "A 0.62mW Ultra-Low-Power Convolutional-Neural-Network Face-Recognition Processor and a CIS Integrated with Always-On Haar-Like Face Detector," International Solid-State Circuits Conference, Session 14, Deep-Learning Processors, Feb. 7, 2017, IEEE, 3 pages.
(Continued)

*Primary Examiner* — Sung Il Cho
(74) *Attorney, Agent, or Firm* — W&T/Qualcomm

(57) ABSTRACT

Transpose static random access memory (SRAM) bit cells configured for horizontal and vertical read operations are disclosed. In one aspect, a transpose SRAM bit cell includes cross-coupled inverters and horizontal and vertical read access transistors. A word line in first metal layer having an axis in a first direction is electrically coupled to a gate node of the horizontal read access transistor, and a bit line in second metal layer having an axis disposed in a second direction substantially orthogonal to the first direction is electrically coupled to the horizontal read access transistor. A transpose word line in third metal layer having an axis disposed in the second direction is electrically coupled to a gate node of the vertical read access transistor, and a transpose bit line in fourth metal layer having an axis disposed in the first direction is electrically coupled to the vertical read access transistor.

19 Claims, 10 Drawing Sheets

(51) Int. Cl.
*G11C 11/412* (2006.01)
*G11C 7/10* (2006.01)
*G11C 8/16* (2006.01)
*H01L 27/02* (2006.01)
*H01L 23/528* (2006.01)

(52) U.S. Cl.
CPC ........ *G11C 11/412* (2013.01); *H01L 27/0207* (2013.01); *H01L 27/1104* (2013.01); *H01L 23/528* (2013.01)

(58) Field of Classification Search
USPC .......................................................... 365/154
See application file for complete search history.

(56) References Cited

U.S. PATENT DOCUMENTS

| | | | | |
|---|---|---|---|---|
| 6,104,663 | A * | 8/2000 | Kablanian | G11C 8/16 365/154 |
| 6,674,670 | B2 * | 1/2004 | Jeung | G11C 8/16 365/154 |
| 9,646,974 | B1 * | 5/2017 | Liaw | H01L 27/1104 |
| 9,672,903 | B2 * | 6/2017 | Liaw | H01L 27/1116 |
| 2002/0130426 | A1 * | 9/2002 | Karasawa | H01L 27/11 257/390 |
| 2004/0232497 | A1 * | 11/2004 | Akiyama | H01L 23/5223 257/390 |
| 2007/0008760 | A1 * | 1/2007 | Nii | G11C 15/04 365/233.1 |
| 2009/0129174 | A1 * | 5/2009 | Madurawe | G11C 8/16 365/189.08 |
| 2009/0244955 | A1 * | 10/2009 | Sasaki | G11C 11/412 365/154 |
| 2009/0254697 | A1 | 10/2009 | Akerib et al. | |
| 2010/0259971 | A1 * | 10/2010 | Liaw | G11C 8/16 365/154 |
| 2011/0096582 | A1 | 4/2011 | Arsovski et al. | |
| 2014/0254249 | A1 | 9/2014 | Huang et al. | |
| 2015/0036417 | A1 * | 2/2015 | Jung | G06F 17/5072 365/154 |
| 2015/0357030 | A1 | 12/2015 | Iyer et al. | |
| 2017/0154671 | A1 * | 6/2017 | Liaw | G11C 11/412 |
| 2017/0278555 | A1 * | 9/2017 | Su | G11C 7/12 |

OTHER PUBLICATIONS

Bong, Kyeongryeol, et al., "A 0.62mW Ultra-Low-Power Convolutional-Neural-Network Face-Recognition Processor and a CIS Integrated with Always-On Haar-Like Face Detector," Presentation at the International Solid-State Circuits Conference, 14.6, Feb. 7, 2017, IEEE, 32 pages.

* cited by examiner

TRANSPOSE STATIC RANDOM ACCESS MEMORY (SRAM) BIT CELLS CONFIGURED FOR HORIZONTAL AND VERTICAL READ OPERATIONS

BACKGROUND

I. Field of the Disclosure

The technology of the disclosure relates generally to static random access memory (SRAM), and particularly to configuring SRAM bit cells for particular read operations.

II. Background

Processor-based computer systems include memory for data storage. Different types of memory exist, each possessing certain unique features. For example, static random access memory (SRAM) is a type of memory that can be employed in processor-based computer systems. SRAM can store data without the need to periodically refresh the memory, unlike dynamic random access memory (DRAM) for example. An SRAM contains a plurality of SRAM bit cells (also referred to as "bit cells") organized in rows and columns in an SRAM data array. For any given row in an SRAM data array, each column of the SRAM data array includes an SRAM bit cell in which a single data value or bit is stored. Read and write operations are performed on a particular SRAM bit cell using read and write word lines which correspond to the SRAM bit cell row that includes the particular SRAM bit cell.

Data stored in an SRAM data array can be used for a multitude of operations. For example, artificial intelligence (AI) applications may store data in an SRAM data array corresponding to certain rows and columns in the form of a matrix, as matrices are conducive to AI calculations. In particular, AI calculations conventionally involve matrix multiplication, such as performing one or more rounds of mathematical convolution to filter an image for facial recognition applications. For example, FIG. 1A illustrates an exemplary SRAM data array 100 storing pixels corresponding to an image 102 on which a separable filter convolution is performed by completing conventional row-based read operations. In particular, to perform convolution for the image 102, a selected portion 104 of the image 102 is multiplied by a d×d convolution matrix 106. In this example, the portion 104 of the image 102 is a matrix formed from selected pixels of the image 102. However, the computations associated with the convolution in FIG. 1A are time and power intensive.

In this regard, instead of performing the convolution in FIG. 1A (i.e., multiplying the portion 104 by the d×d convolution matrix 106), a similar result can be achieved by performing a simpler convolution approximation illustrated in FIG. 1B. For example, FIG. 1B illustrates the SRAM data array 100 on which a separable filter convolution approximation is performed by completing conventional row-based read operations to save power and processing time. In particular, instead of multiplying the portion 104 by the d×d convolution matrix 106 in FIG. 1A, the convolution approximation includes multiplying the portion 104 by a d×1 convolution matrix 108, and multiplying the product of the first multiplication by a 1×d convolution matrix 110. Performing the convolution approximation illustrated in FIG. 1B generates a substantially similar result compared to the convolution in FIG. 1A, but can be completed in less time and with less power consumption.

However, the convolution approximation of FIG. 1B involves performing calculations on corresponding columns of the SRAM data array 100 for the d×1 convolution matrix 108 computation. Unfortunately, while conventional read operations can efficiently read the SRAM data array 100 on a row basis (i.e., horizontal reading), the SRAM data array 100 cannot be efficiently read on a column basis (i.e., vertical reading). In particular, to read a column of the SRAM data array 100, each corresponding row of the SRAM data array 100 must be read using separate read operations, wherein multiple read operations are power and time intensive.

SUMMARY OF THE DISCLOSURE

Aspects disclosed in the detailed description include transpose static random access memory (SRAM) bit cells configured for horizontal and vertical read operations. In one aspect, a transpose SRAM bit cell includes a horizontal read access transistor electrically coupled to cross-coupled inverters configured to store a data value, wherein the horizontal read access transistor is activated for horizontal read operations (i.e., reads corresponding to an SRAM row). In particular, a word line disposed in a first metal layer and having an axis disposed in a first direction is electrically coupled to a gate node of the horizontal read access transistor, while a bit line disposed in a second metal layer and having an axis disposed in a second direction substantially orthogonal to the first direction is electrically coupled to another node of the horizontal read access transistor. The data value stored in the cross-coupled inverters is indicated on the bit line in response to a voltage applied to the word line activating the horizontal read access transistor. The transpose SRAM bit cell also includes a vertical read access transistor that is activated for vertical read operations (i.e., reads corresponding to an SRAM column). In particular, a transpose word line disposed in a third metal layer and having an axis disposed in the second direction is electrically coupled to a gate node of the vertical read access transistor, while a transpose bit line disposed in a fourth metal layer and having an axis disposed in the first direction is electrically coupled to another node of the vertical read access transistor. The data value stored in the cross-coupled inverters (or a complement of the data value) is indicated on the transpose bit line in response to a voltage applied to the transpose word line activating the vertical read access transistor. Configuring the word line/transpose word line and the bit line/transpose bit line as described above allows a transpose SRAM data array formed from the transpose SRAM bit cells to be read on an SRAM row or SRAM column basis. Thus, applications that benefit from SRAM row and SRAM column data can use a transpose SRAM data array to achieve such calculations in less time and with less power consumption.

In this regard in one aspect, a transpose SRAM bit cell is provided. The transpose SRAM bit cell comprises a first inverter and a second inverter formed over a substrate and cross-coupled such that the first inverter and the second inverter are configured to store a data value. The transpose SRAM bit cell further comprises a horizontal read access transistor formed over the substrate that includes a first node electrically coupled to an output node of the first inverter, a second node, and a gate node. The transpose SRAM bit cell further comprises a vertical read access transistor formed over the substrate that includes a first node, a second node, and a gate node. The transpose SRAM bit cell further comprises a word line disposed in a first metal layer and having an axis disposed in a first direction, wherein the word line is electrically coupled to the gate node of the horizontal read access transistor. The transpose SRAM bit cell further comprises a bit line disposed in a second metal layer and having an axis disposed in a second direction substantially orthogonal to the first direction, wherein the bit line is electrically coupled to the second node of the horizontal read access transistor, wherein the bit line indicates the data value in response to a voltage applied to the word line activating the horizontal read access transistor; a transpose word line disposed in a third metal layer and having an axis disposed in the second direction, wherein the transpose word line is electrically coupled to the gate node of the vertical read access transistor. The transpose SRAM bit cell further comprises a transpose bit line disposed in a fourth metal layer and having an axis disposed in the first direction, wherein the transpose bit line is electrically coupled to the second node of the vertical read access transistor, wherein the transpose bit line indicates the data value in response to a voltage applied to the transpose word line activating the vertical read access transistor.

In another aspect, a transpose SRAM bit cell is provided. The transpose SRAM bit cell comprises a means for storing a data value formed over a substrate. The transpose SRAM bit cell further comprises a first means for accessing the data value. The transpose SRAM bit cell further comprises a second means for accessing the data value; a means for activating the first means for accessing the data value disposed in a first metal layer and having an axis disposed in a first direction. The transpose SRAM bit cell further comprises a means for receiving the data value via the first means for accessing the data value disposed in a second metal layer and having an axis disposed in a second direction substantially orthogonal to the first direction. The transpose SRAM bit cell further comprises a means for activating the second means for accessing the data value disposed in a third metal layer and having an axis disposed in the second direction. The transpose SRAM bit cell further comprises a means for receiving the data value via the second means for accessing the data value disposed in a fourth metal layer and having an axis disposed in the first direction.

In another aspect, a method of performing a vertical read operation and a horizontal read operation on a transpose SRAM bit cell is provided. The method comprises applying a voltage to a word line disposed in a first metal layer and having an axis disposed in a first direction, wherein the word line is electrically coupled to a horizontal read access transistor configured to access a data value stored by a first inverter cross-coupled with a second inverter. The method further comprises responsive to applying the voltage to the word line, sensing a voltage on a bit line disposed in a second metal layer and having an axis disposed in a second direction substantially orthogonal to the first direction, wherein the bit line is electrically coupled to the horizontal read access transistor. The method further comprises applying a voltage to a transpose word line disposed in a third metal layer and having an axis disposed in the second direction, wherein the transpose word line is electrically coupled to a gate node of a vertical read access transistor. The method further comprises responsive to applying the voltage to the transpose word line, sensing a voltage on a transpose bit line disposed in a fourth metal layer and having an axis disposed in the first direction, wherein the transpose bit line is electrically coupled to the vertical read access transistor configured to access the data value stored by the first inverter cross-coupled with the second inverter.

In another aspect, a transpose SRAM data array is provided. The transpose SRAM data array comprises a plurality of transpose SRAM bit cells organized into a plurality of transpose SRAM rows and a plurality of transpose SRAM columns, wherein each transpose SRAM bit cell of the plurality of transpose SRAM bit cells corresponds to a transpose SRAM row and a transpose SRAM column. Each transpose SRAM bit cell comprises a first inverter and a second inverter formed over a substrate and cross-coupled such that the first inverter and the second inverter are configured to store a data value. Each transpose SRAM bit cell further comprises a horizontal read access transistor formed over the substrate that includes a first node electrically coupled to an output node of the first inverter, a second node, and a gate node. Each transpose SRAM bit cell further comprises a vertical read access transistor formed over the substrate that includes a first node, a second node, and a gate node. The transpose SRAM data array further comprises a plurality of word lines. Each word line is disposed in a first metal layer, has an axis disposed in a first direction, and is electrically coupled to the gate node of the horizontal read access transistor of each transpose SRAM bit cell of a corresponding transpose SRAM row. The transpose SRAM data array further comprises a plurality of bit lines, wherein: each bit line is disposed in a second metal layer, has an axis disposed in a second direction substantially orthogonal to the first direction, and is electrically coupled to the second node of the horizontal read access transistor of each transpose SRAM bit cell of a corresponding transpose SRAM column. The data value is indicated on the bit line in response to a voltage applied to the word line activating the horizontal read access transistor. The transpose SRAM data array further comprises a plurality of transpose word lines, wherein each transpose word line is disposed in a third metal layer, has an axis disposed in the second direction, and is electrically coupled to the gate node of the vertical read access transistor of each transpose SRAM bit cell of a corresponding transpose SRAM column. The transpose SRAM data array further comprises a plurality of transpose bit lines, wherein each transpose bit line is disposed in a fourth metal layer, has an axis disposed in the first direction, and is electrically coupled to the second node of the vertical read access transistor of each transpose SRAM bit cell of a corresponding transpose SRAM row. The transpose SRAM data array further comprises a plurality of horizontal sense amplifiers, wherein each horizontal sense amplifier of the plurality of horizontal sense amplifiers is electrically coupled to the bit line of each corresponding transpose SRAM column, and configured to sense the data value indicated on the bit line and generate a corresponding horizontal output data value. The transpose SRAM data array further comprises a plurality of vertical sense amplifiers, wherein each vertical sense amplifier of the plurality of vertical sense amplifiers is electrically coupled to the transpose bit line of each corresponding transpose SRAM row, and configured to sense the data value indicated on the transpose bit line and generate a corresponding vertical output data value.

DETAILED DESCRIPTION

Figure 1A:
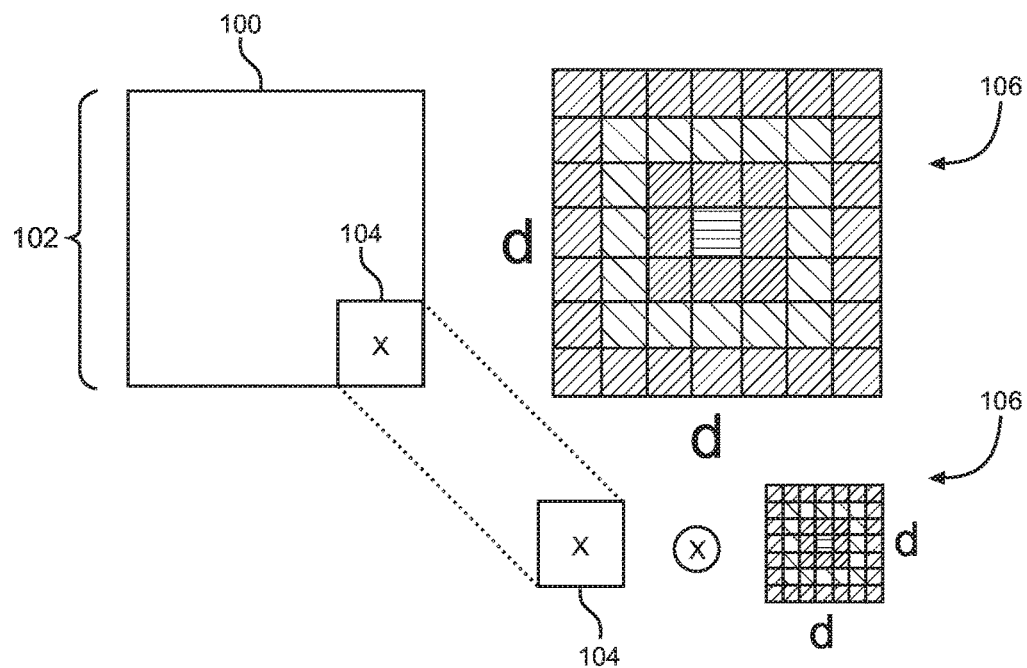
FIG. 1A is a block diagram illustrating an exemplary conventional static random access memory (SRAM) data array on which a separable filter convolution is performed using a d×d matrix.
Figure 1B:
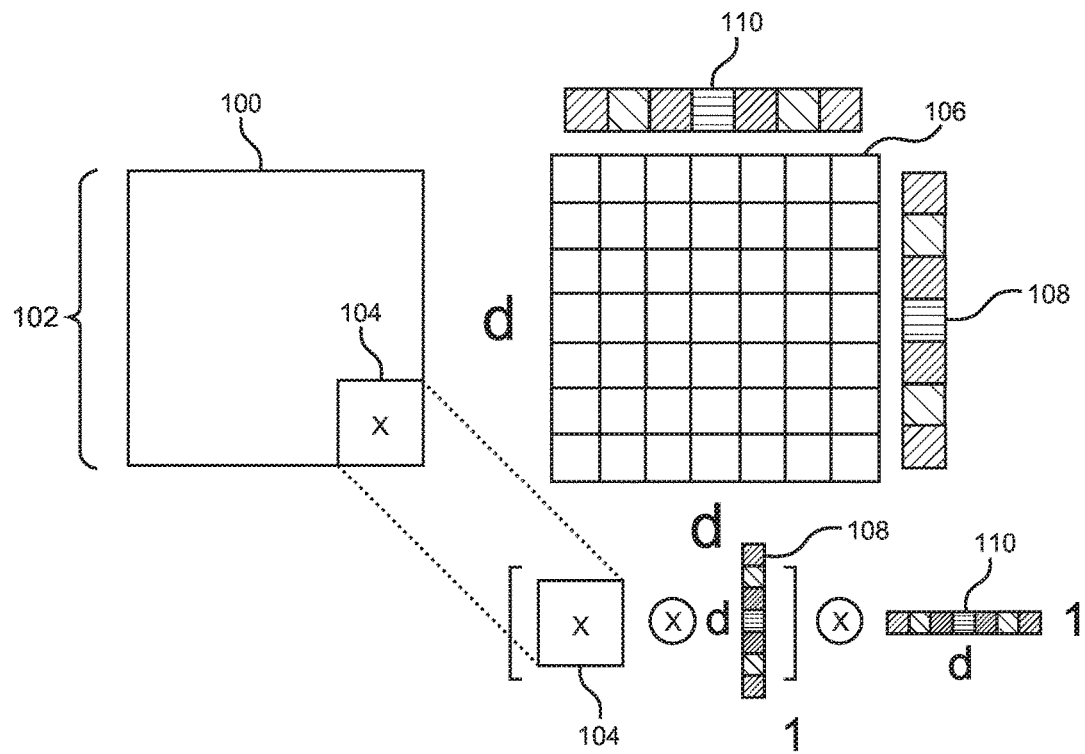
FIG. 1B is a block diagram illustrating an exemplary conventional SRAM data array on which a separable filter convolution approximation is performed by completing conventional row-based read operations.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include transpose static random access memory (SRAM) bit cells configured for horizontal and vertical read operations. In one aspect, a transpose SRAM bit cell includes a horizontal read access transistor electrically coupled to cross-coupled inverters configured to store a data value, wherein the horizontal read access transistor is activated for horizontal read operations (i.e., reads corresponding to an SRAM row). In particular, a word line disposed in a first metal layer and having an axis disposed in a first direction is electrically coupled to a gate node of the horizontal read access transistor, while a bit line disposed in a second metal layer and having an axis disposed in a second direction substantially orthogonal to the first direction is electrically coupled to another node of the horizontal read access transistor. The data value stored in the cross-coupled inverters is indicated on the bit line in response to a voltage applied to the word line activating the horizontal read access transistor. The transpose SRAM bit cell also includes a vertical read access transistor that is activated for vertical read operations (i.e., reads corresponding to an SRAM column). In particular, a transpose word line disposed in a third metal layer and having an axis disposed in the second direction is electrically coupled to a gate node of the vertical read access transistor, while a transpose bit line disposed in a fourth metal layer and having an axis disposed in the first direction is electrically coupled to another node of the vertical read access transistor. The data value stored in the cross-coupled inverters (or a complement of the data value) is indicated on the transpose bit line in response to a voltage applied to the transpose word line activating the vertical read access transistor. Configuring the word line/transpose word line and the bit line/transpose bit line as described above allows a transpose SRAM data array formed from the transpose SRAM bit cells to be read on an SRAM row or SRAM column basis. Thus, applications that benefit from SRAM row and SRAM column data can use a transpose SRAM data array to achieve such calculations in less time and with less power consumption.

Figure 2A:
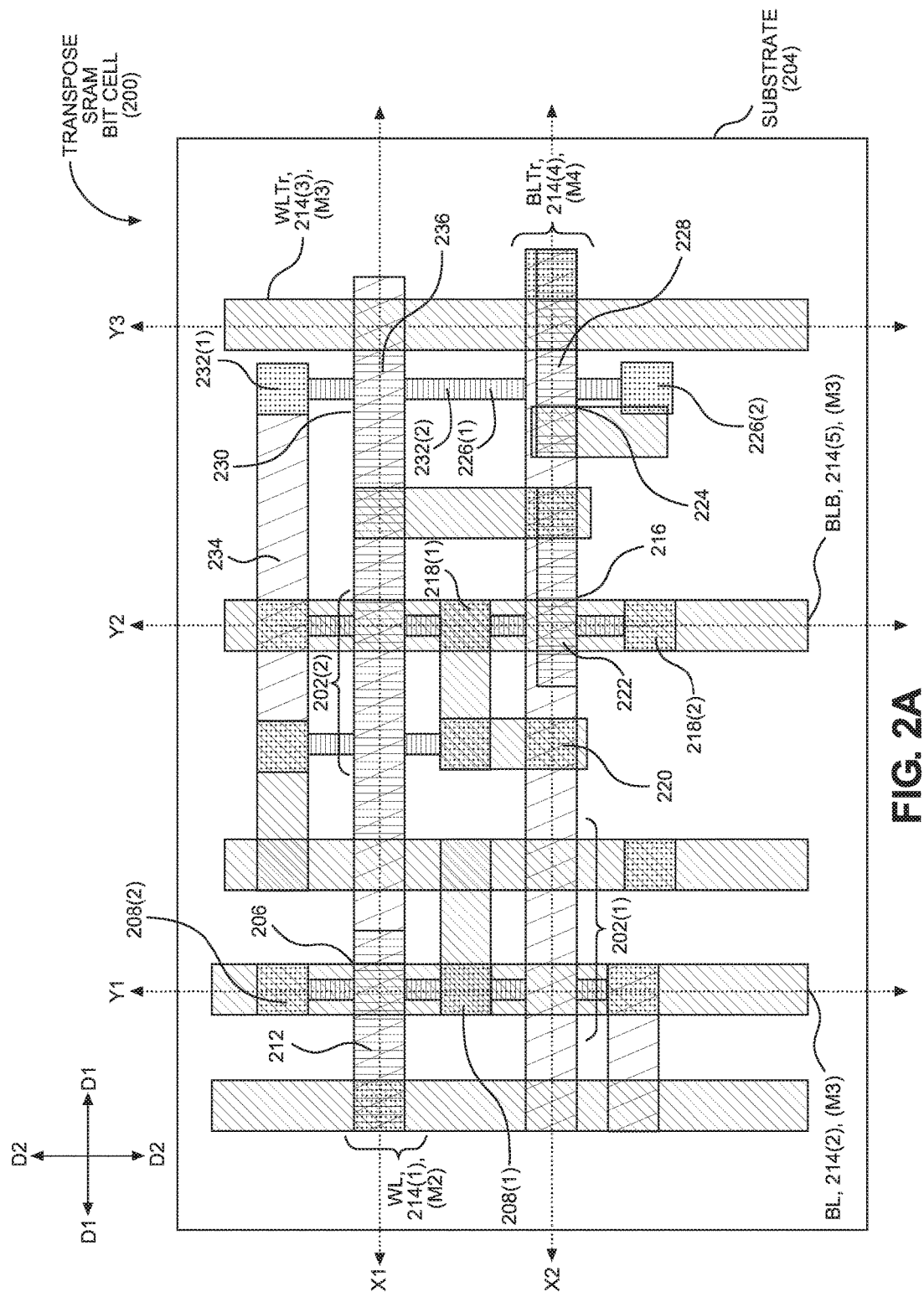
FIG. 2A is a layout diagram of an exemplary transpose SRAM bit cell employing a word line and a bit line configured for horizontal read operations, and a transpose word line and a transpose bit line for vertical read operations.
Figure 2B:
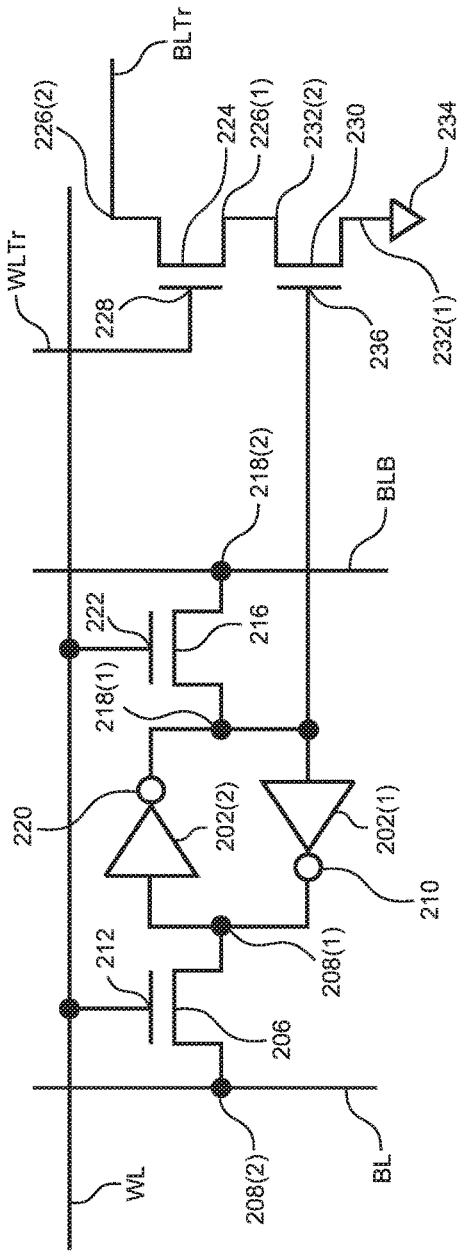
FIG. 2B is a circuit diagram of the exemplary transpose SRAM bit cell in FIG. 2A.
Figure 2C:
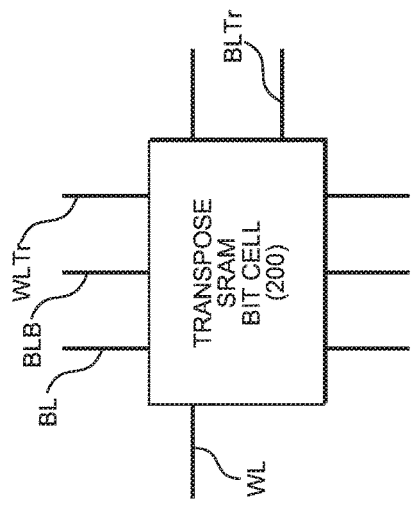
FIG. 2C is a block diagram of the exemplary transpose SRAM bit cell in FIG. 2A.

In this regard, FIGS. 2A-2C illustrate an exemplary transpose SRAM bit cell 200 employing a word line WL and bit line BL for horizontal read operations, and a transpose word line WLTr and transpose bit line BLTr for vertical read operations. FIG. 2A is a layout diagram of the transpose SRAM bit cell 200, FIG. 2B is a circuit diagram of the transpose SRAM bit cell 200, and FIG. 2C is a block diagram of the transpose SRAM bit cell 200. In this aspect, the transpose SRAM bit cell 200 is an eight (8) transistor (8T) transpose SRAM bit cell. However, as discussed below, other aspects may include a six (6) transistor (6T) transpose SRAM bit cell.

With continuing reference to FIGS. 2A-2C, the transpose SRAM bit cell 200 includes a first inverter 202(1) and a second inverter 202(2) formed over a substrate 204 and cross-coupled such that the first and second inverters 202(1), 202(2) are configured to store a data value. The transpose SRAM bit cell 200 also employs a horizontal read access transistor 206 formed over the substrate 204 that is activated for horizontal read operations (e.g., reads corresponding to an SRAM row). In this aspect, the horizontal read access transistor 206 is an N-type metal-oxide semiconductor (MOS) (NMOS) transistor. However, other aspects may employ other transistor types. In this manner, the horizontal read access transistor 206 includes a first node 208(1) (e.g., a drain node) electrically coupled to an output node 210 of the first inverter 202(1), a second node 208(2) (e.g., a source node), and a gate node 212. The word line WL is disposed in a first metal layer 214(1) (e.g., a metal two (M2) layer) and has an axis X1 disposed in a first direction D1, and is electrically coupled to the gate node 212 of the horizontal read access transistor 206.

With continuing reference to FIGS. 2A-2C, the bit line BL is disposed in a second metal layer 214(2) (e.g., a metal three (M3) layer) and has an axis Y1 disposed in a second direction D2 substantially orthogonal to the first direction D1, and is electrically coupled to the second node 208(2) of the horizontal read access transistor 206. The data value stored in the first and second inverters 202(1), 202(2) is indicated on the bit line BL in response to a voltage applied to the word line WL activating the horizontal read access transistor 206. In this aspect, the transpose SRAM bit cell 200 also includes a second horizontal read access transistor 216 formed over the substrate 204, wherein the second horizontal read access transistor 216 is an NMOS transistor. The second horizontal read access transistor 216 includes a first node 218(1) (e.g., a drain node) electrically coupled to an output node 220 of the second inverter 202(2), a second node 218(2) (e.g., a source node) electrically coupled to a complement bit line BLB disposed in a fifth metal layer 214(5) (e.g., a metal three (M3) layer) and has an axis Y2 disposed in the second direction D2, and a gate node 222 electrically coupled to the word line WL.

With continuing reference to FIGS. 2A-2C, the transpose SRAM bit cell 200 also includes a vertical read access transistor 224 formed over the substrate 204 that is activated for vertical read operations (i.e., reads corresponding to an SRAM column). In this aspect, the vertical read access transistor 224 is employed as an NMOS transistor. In this manner, the vertical read access transistor 224 includes a first node 226(1) (e.g., a drain node), a second node 226(2) (e.g., a source node), and a gate node 228. Further, in this aspect, a second vertical read access transistor 230 is formed over the substrate 204 as an NMOS transistor. The second vertical read access transistor 230 includes a first node 232(1) (e.g., a drain node) electrically coupled to a ground source 234, a second node 232(2) (e.g., a source node) electrically coupled to the first node 226(1) of the vertical read access transistor 224, and a gate node 236 electrically coupled to the output node 220 of the second inverter 202(2). A transpose word line WLTr is disposed in a third metal layer 214(3) (e.g., a metal three (M3) layer) and has an axis Y3 disposed in the second direction D2, and is electrically coupled to the gate node 228 of the vertical read access transistor 224. Additionally, a transpose bit line BLTr is disposed in a fourth metal layer 214(4) (e.g., a metal four (M4) layer) and has an axis X2 disposed in the first direction D1, and is electrically coupled to the second node 226(2) of the vertical read access transistor 224. It is worth noting that, as described in this aspect, some combination of the first, second, third, fourth, and fifth metal layers 214(1)-214(5) may be disposed in the same metal layer (e.g., M2, M3, or M4). However, the first, second, third, fourth, and fifth metal layers 214(1)-214(5) are not limited to the example metal layers described in aspects herein, wherein each of the first, second, third, fourth, and fifth metal layers 214(1)-214(5) may be disposed in a different metal layer.

With continuing reference to FIGS. 2A-2C, in response to a voltage applied to the word line WL activating the horizontal read access transistor 206, if the data value on the output node 210 of the first inverter 202(1) is a logic '0,' then the data value of logic '0' stored in the transpose SRAM bit cell 200 is indicated on the bit line BL. Alternatively, if the data value on the output node 210 of the first inverter 202(1) is a logic '1,' then the data value of logic '1' stored in the transpose SRAM bit cell 200 is indicated on the bit line BL. Further, in response to a voltage applied to the transpose word line WLTr activating the vertical read access transistor 224, if a complement of the data value on the output node 220 of the second inverter 202(2) activates the second vertical read access transistor 230, then the ground source 234 is electrically coupled to the transpose bit line BLTr, indicating that a logic '0' is stored in the transpose SRAM bit cell 200. Alternatively, if the complement of the data value on the output node 220 of the second inverter 202(2) does not activate the second vertical read access transistor 230, then the transpose bit line BLTr retains a pre-charged logic '1' value, indicating that a logic '1' is stored in the transpose SRAM bit cell 200. Configuring the word line WL/transpose word line WLTr and the bit line BL/transpose bit line BLTr as described above allows a transpose SRAM data array formed from the transpose SRAM bit cell 200 to be read on an SRAM row or SRAM column basis. Thus, applications that benefit from SRAM row and SRAM column data, such as image convolution calculations, can use a transpose SRAM data array to achieve such calculations in less time and with less power consumption.

Figure 3:
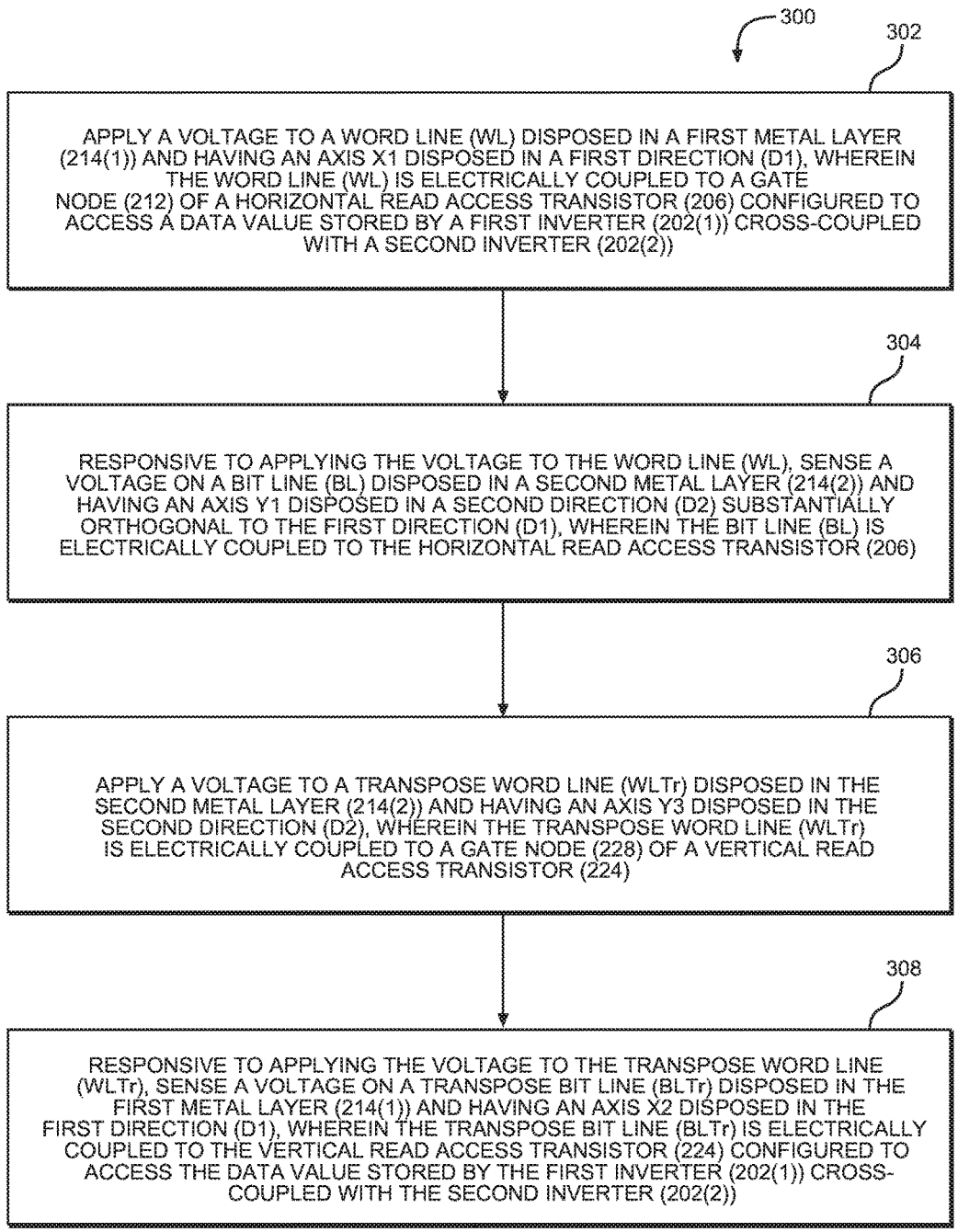
FIG. 3 is a flowchart illustrating an exemplary process of performing a vertical read operation and a horizontal read operation on the transpose SRAM bit cell of FIGS. 2A-2C.

FIG. 3 illustrates an exemplary process 300 of performing a vertical read operation and a horizontal read operation on the transpose SRAM bit cell 200 of FIGS. 2A-2C. The process 300 includes applying a voltage to the word line WL disposed in the first metal layer 214(1) and having the axis X1 disposed in the first direction D1, wherein the word line WL is electrically coupled to the gate node 212 of the horizontal read access transistor 206 configured to access the data value stored by the first inverter 202(1) cross-coupled with the second inverter 202(2) (block 302). The process 300 also includes, responsive to applying the voltage to the word line WL, sensing a voltage on the bit line BL disposed in the second metal layer 214(2) and having the axis Y1 disposed in the second direction D2 substantially orthogonal to the first direction D1 and electrically coupled to the horizontal read access transistor 206 (block 304). Additionally, the process 300 includes applying a voltage to the transpose word line WLTr disposed in the third metal layer 214(3) and having the axis Y3 disposed in the second direction D2, wherein the transpose word line WLTr is electrically coupled to the gate node 228 of the vertical read access transistor 224 (block 306). The process 300 also includes, responsive to applying the voltage to the transpose word line WLTr, sensing a voltage on the transpose bit line BLTr disposed in the fourth metal layer 214(4) and having the axis X2 disposed in the first direction D1, wherein the transpose bit line BLTr is electrically coupled to the vertical read access transistor 224 configured to access the data value stored by the first inverter 202(1) cross-coupled with the second inverter 202(2) (block 308).

Figure 4A:
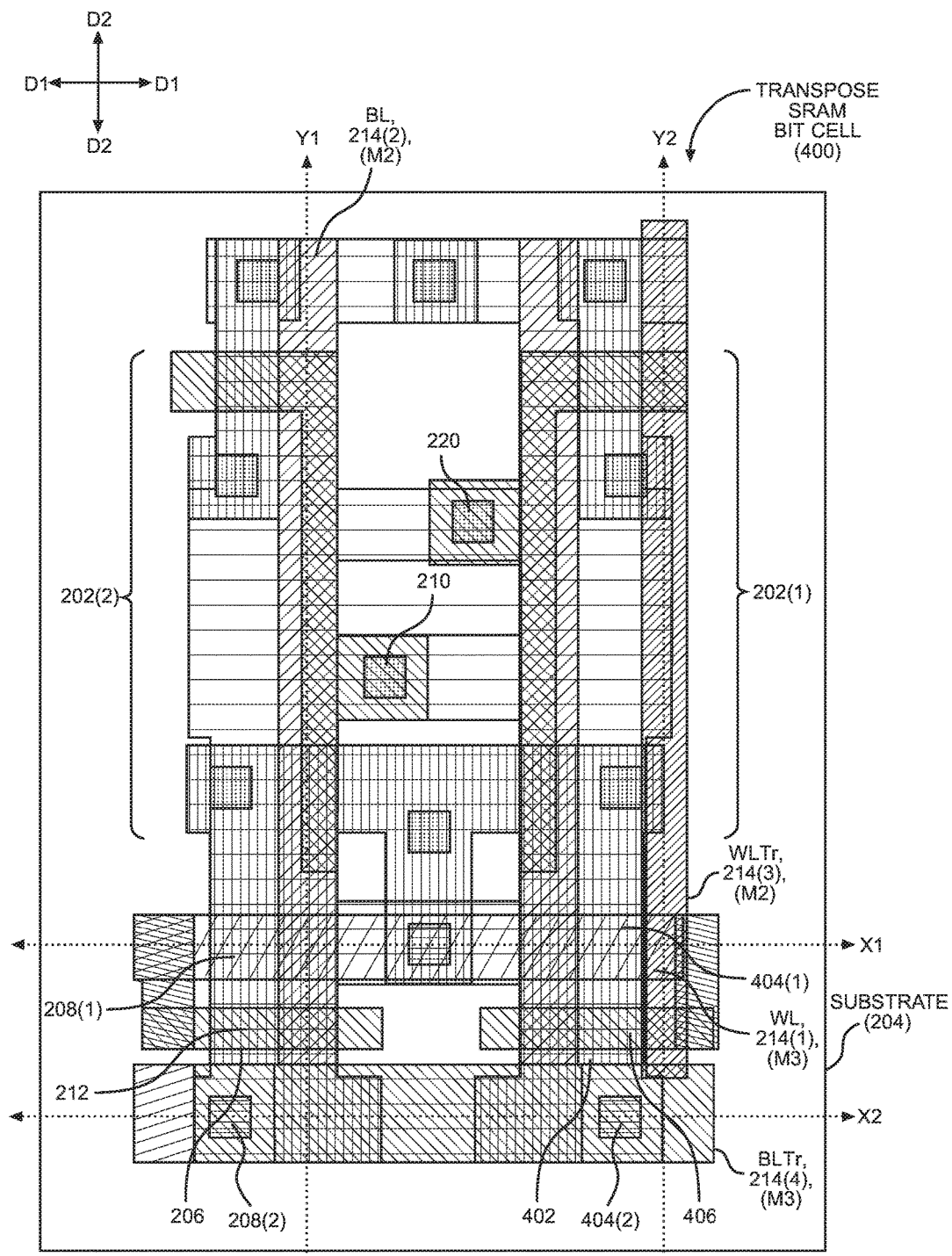
FIG. 4A is a layout diagram of another exemplary transpose SRAM bit cell employing a word line and a bit line configured for horizontal read operations, and a transpose word line and a transpose bit line for vertical read operations.
Figure 4B:
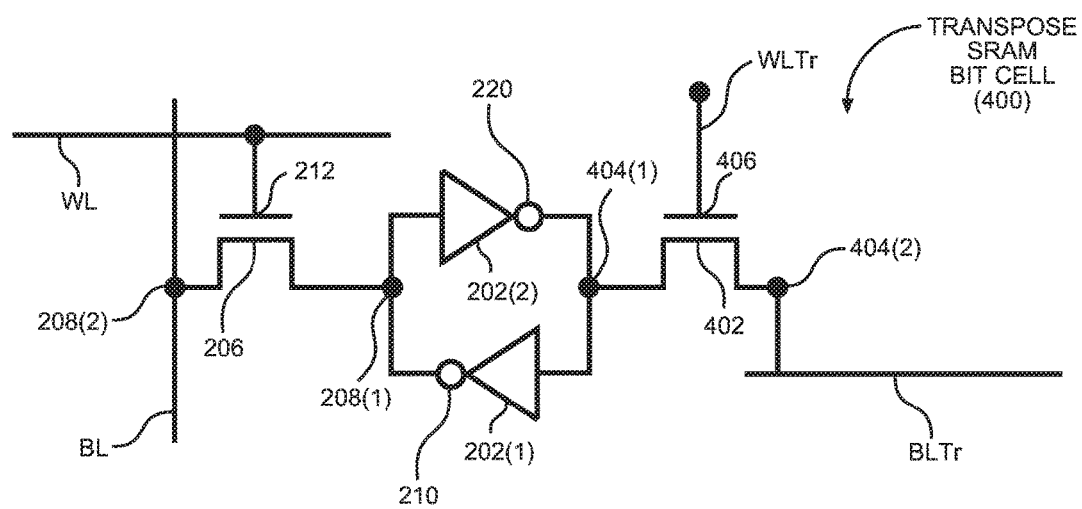
FIG. 4B is a circuit diagram of the exemplary transpose SRAM bit cell in FIG. 4A.
Figure 4C:
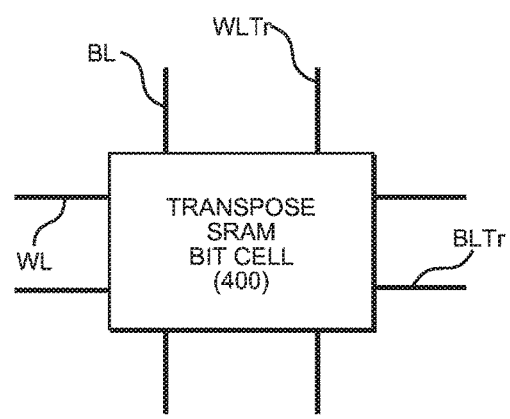
FIG. 4C is a block diagram of the exemplary transpose SRAM bit cell in FIG. 4A.

As referenced above, in addition to the transpose SRAM bit cell 200 of FIGS. 2A-2C employed as an 8T SRAM bit cell, other aspects may be employed as 6T SRAM bit cells. In this regard, FIGS. 4A-4C illustrate another exemplary transpose SRAM bit cell 400 employing a word line WL and a bit line BL for horizontal read operations, and a transpose word line WLTr and a transpose bit line BLTr for vertical read operations, wherein the transpose SRAM bit cell 400 is a 6T transpose SRAM bit cell 400. FIG. 4A is a layout diagram of the transpose SRAM bit cell 400, FIG. 4B is a circuit diagram of the transpose SRAM bit cell 400, and FIG. 4C is a block diagram of the transpose SRAM bit cell 400. The transpose SRAM bit cell 400 includes common elements with the transpose SRAM bit cell 200 of FIGS. 2A-2C, which are referred to with common element numbers in FIGS. 2A-2C and FIGS. 4A-4C, and thus will not be re-described herein.

With continuing reference to FIGS. 4A-4C, the transpose SRAM bit cell 400 includes a first inverter 202(1) and a second inverter 202(2) formed over a substrate 204 and cross-coupled such that the first and second inverters 202(1), 202(2) are configured to store a data value. The transpose SRAM bit cell 400 also employs a horizontal read access transistor 206 formed over the substrate 204 and that is activated for horizontal read operations (e.g., reads corresponding to an SRAM row). In this aspect, the horizontal read access transistor 206 is an NMOS transistor. However, other aspects may employ other transistor types. In this manner, the horizontal read access transistor 206 includes a first node 208(1) (e.g., a drain node) electrically coupled to an output node 210 of the first inverter 202(1), a second node 208(2) (e.g., a source node), and a gate node 212. The word line WL is disposed in a first metal layer 214(1) (e.g., a metal three (M3) layer) and having an axis X1 disposed in a first direction D1. The word line WL is electrically coupled to the gate node 212 of the horizontal read access transistor 206. The bit line BL is disposed in a second metal layer 214(2) (e.g., a metal two (M2) layer) and has an axis Y1 disposed in a second direction D2 substantially orthogonal to the first direction D1. The bit line BL is electrically coupled to the second node 208(2) of the horizontal read access transistor 206. The data value stored in the first and second inverters 202(1), 202(2) is indicated on the bit line BL in response to a voltage applied to the word line WL activating the horizontal read access transistor 206.

With continuing reference to FIGS. 4A-4C, the transpose SRAM bit cell 400 also includes a vertical read access transistor 402 formed over the substrate 204 and that is activated for vertical read operations (i.e., reads corresponding to an SRAM column). In this aspect, the vertical read access transistor 402 is employed as an NMOS transistor. In this manner, the vertical read access transistor 402 includes a first node 404(1) (e.g., a drain node) electrically coupled to an output node 220 of the second inverter 202(2), a second node 404(2) (e.g., a source node), and a gate node 406. A transpose word line WLTr is disposed in the third metal layer 214(3) (e.g., the metal two (M2) layer) and has an axis Y2 disposed in the second direction D2. The transpose word line WLTr is electrically coupled to the gate node 406 of the vertical read access transistor 402. Additionally, a transpose bit line BLTr is disposed in the fourth metal layer 214(4) (e.g., the metal three (M3) layer) and has an axis X2 disposed in the first direction D1. The transpose bit line BLTr is electrically coupled to the second node 404(2) of the vertical read access transistor 402.

With continuing reference to FIGS. 4A-4C, in response to a voltage applied to the word line WL activating the horizontal read access transistor 206, if the data value on the output node 210 of the first inverter 202(1) is a logic '0,' then the data value of logic '0' stored in the transpose SRAM bit cell 400 is indicated on the bit line BL. Alternatively, if the data value on the output node 210 of the first inverter 202(1) is a logic '1,' then the data value of logic '2' stored in the transpose SRAM bit cell 400 is indicated on the bit line BL. Further, in response to a voltage applied to the transpose word line WLTr activating the vertical read access transistor 402, if a complement of the data value on the output node 220 of the second inverter 202(2) is a logic '0,' then the complement data value of logic '0' is indicated on the transpose bit line BLTr. Alternatively, if the complement of the data value on the output node 220 of the second inverter 202(2) is a logic '1,' then the complement data value of logic '1' is indicated on the transpose bit line BLTr. Configuring the word line WL/transpose word line WLTr and the bit line BL/transpose bit line BLTr as described above allows a transpose SRAM data array formed from the transpose SRAM bit cell 400 to be read on an SRAM row or SRAM column basis similar to the transpose SRAM bit cell 200 in FIGS. 2A-2C.

Figure 5:
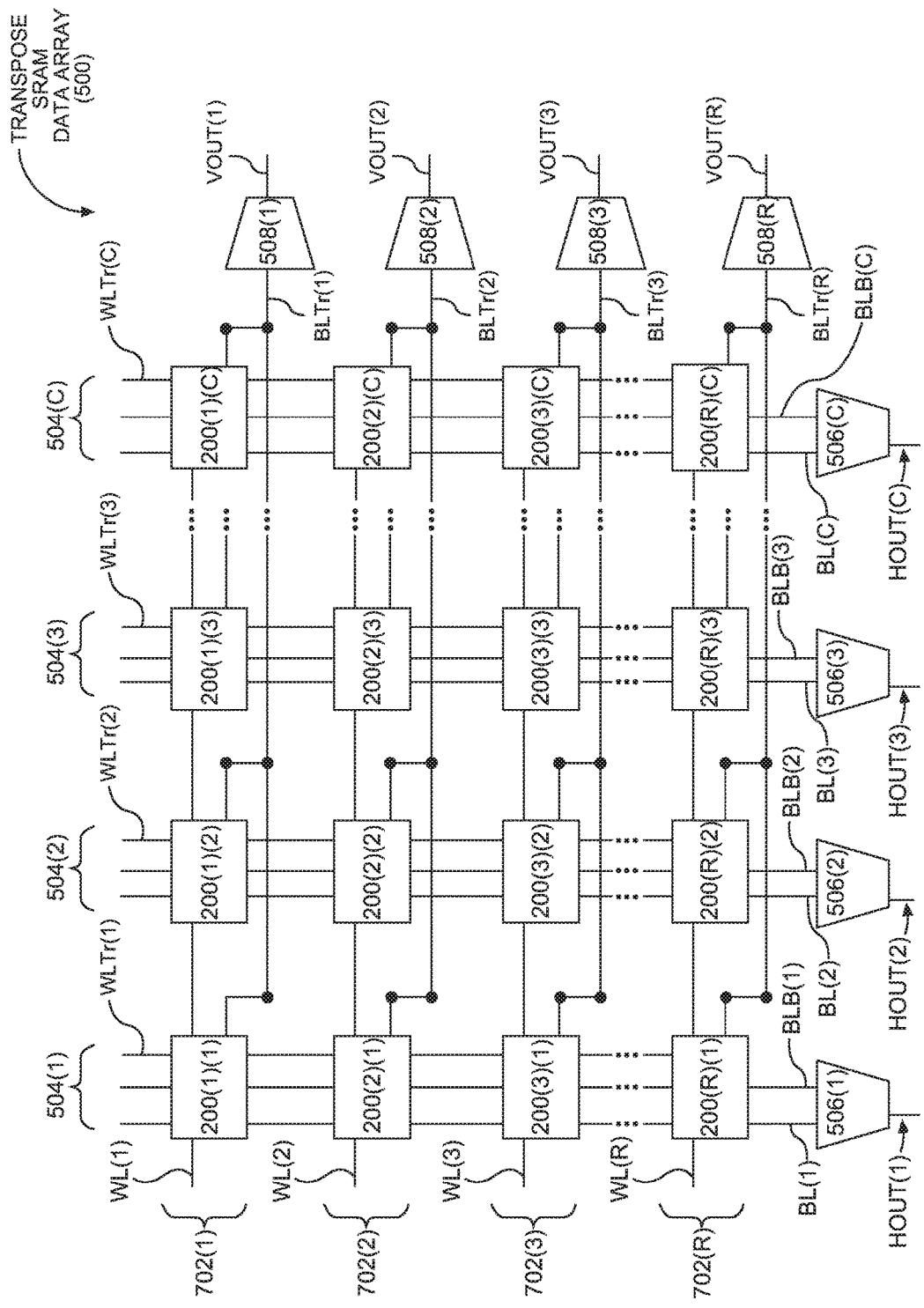
FIG. 5 is an exemplary transpose SRAM data array employing multiple eight (8) transistor (8T) transpose SRAM bit cells of FIGS. 2A-2C and configured to perform horizontal and vertical read operations of the transpose SRAM bit cells.

Multiple instances of the transpose SRAM bit cells 200, 400 in FIGS. 2A-2C and FIGS. 4A-4C, respectively, can be employed to form a transpose SRAM data array that can be read horizontally (e.g., on an SRAM row basis) and vertically (e.g., on an SRAM column basis). In this regard, FIG. 5 illustrates an exemplary transpose SRAM data array 500 employing multiple transpose SRAM bit cells 200(1)(1)-200(R)(C) of FIGS. 2A-2C and configured to perform horizontal and vertical read operations of the transpose SRAM bit cells 200(1)(1)-200(R)(C). The transpose SRAM bit cells 200(1)(1)-200(R)(C) include common elements with the transpose SRAM bit cell 200 of FIGS. 2A-2C, which are referred to with common element numbers in FIG. 5 and FIGS. 2A-2C, and thus will not be re-described herein.

With continuing reference to FIG. 5, the transpose SRAM bit cells 200(1)(1)-200(R)(C) of the transpose SRAM data array 500 are organized into transpose SRAM rows 502(1)-502(R) and transpose SRAM columns 504(1)-504(C). Each transpose SRAM bit cell 200(1)(1)-200(R)(C) corresponds to a transpose SRAM row 502(1)-502(R) and a transpose SRAM column 504(1)-504(C). The transpose SRAM data array 500 also includes horizontal sense amplifiers 506(1)-506(C) (also referred to as horizontal sense comparators 506(1)-506(C)), wherein each horizontal sense amplifier 506(1)-506(C) is electrically coupled to a bit line BL(1)-BL(C) and a complement bit line BLB(1)-BLB(C) of a corresponding transpose SRAM column 504(1)-504(C). Each bit line BL(1)-BL(C) is disposed in a second metal layer 214(2) (not shown), and is electrically coupled to the second node 208(2) of the horizontal read access transistor 206 of each transpose SRAM bit cell 200(1)(1)-200(R)(C) of the corresponding transpose SRAM column 504(1)-504(C). Additionally, each complement bit line BLB(1)-BLB(C) is disposed in a fifth metal layer 214(5), and is electrically coupled to the second node 218(2) of the second horizontal read access transistor 216 of each transpose SRAM bit cell 200(1)(1)-200(R)(C) of the corresponding transpose SRAM column 504(1)-504(C). Each horizontal sense amplifier 506(1)-506(C) is configured to sense the data value indicated on each corresponding bit line BL(1)-BL(C) and complement bit line BLB(1)-BLB(C), and generate a corresponding horizontal SRAM output value HOUT(1)-HOUT(C). Thus, configuring the horizontal sense amplifiers 506(1)-506(C) in this manner allows an entire transpose SRAM row 502(1)-502(R) to be read for a horizontal read operation according to which transpose SRAM bit cells 200(1)(1)-200(R)(C) are activated by a voltage applied to corresponding word lines WL(1)-WL(R) disposed in the first metal layer 214(1) (not shown) and electrically coupled to the gate node 212 of the horizontal read access transistor 206 of each transpose SRAM bit cell 200(1)(1)-200(R)(C) of the corresponding transpose SRAM row 502(1)-502(R).

With continuing reference to FIG. 5, the transpose SRAM data array 500 also includes vertical sense amplifiers 508(1)-508(R) (also referred to as vertical sense comparators 508(1)-508(R)), wherein each vertical sense amplifier 508(1)-508(R) is electrically coupled to a transpose bit line BLTr(1)-BLTr(R) of a corresponding transpose SRAM row 502(1)-502(R). Each transpose bit line BLTr(1)-BLTr(R) is disposed in the fourth metal layer 214(4), and is electrically coupled to the second node 226(2) of the vertical read access transistor 224 of each transpose SRAM bit cell 200(1)(1)-200(R)(C) of the corresponding transpose SRAM row 502(1)-502(R). Each vertical sense amplifier 508(1)-508(R) is configured to sense the data value indicated on each corresponding transpose bit line BLTr(1)-BLTr(R), and generate a corresponding vertical SRAM output value VOUT(1)-VOUT(R). Thus, configuring the vertical sense amplifiers 508(1)-508(R) in this manner allows an entire transpose SRAM column 504(1)-504(C) to be read for a vertical read operation according to which transpose SRAM bit cells 200(1)(1)-200(R)(C) are activated by a voltage applied to corresponding transpose word lines WLTr(1)-WLTr(C) disposed in the third metal layer 214(3) and electrically coupled to the gate node 228 of the vertical read access transistor 224 of each transpose SRAM bit cell 200(1)(1)-200(R)(C) of a corresponding transpose SRAM column 504(1)-504(C). It is worth noting that a horizontal read operation and a vertical read operation may be performed either separately or concurrently on the transpose SRAM data array 500. In other words, an entire transpose SRAM row 502(1)-502(R) may be read at the same time as an entire transpose SRAM column 504(1)-504(C).

Figure 6:
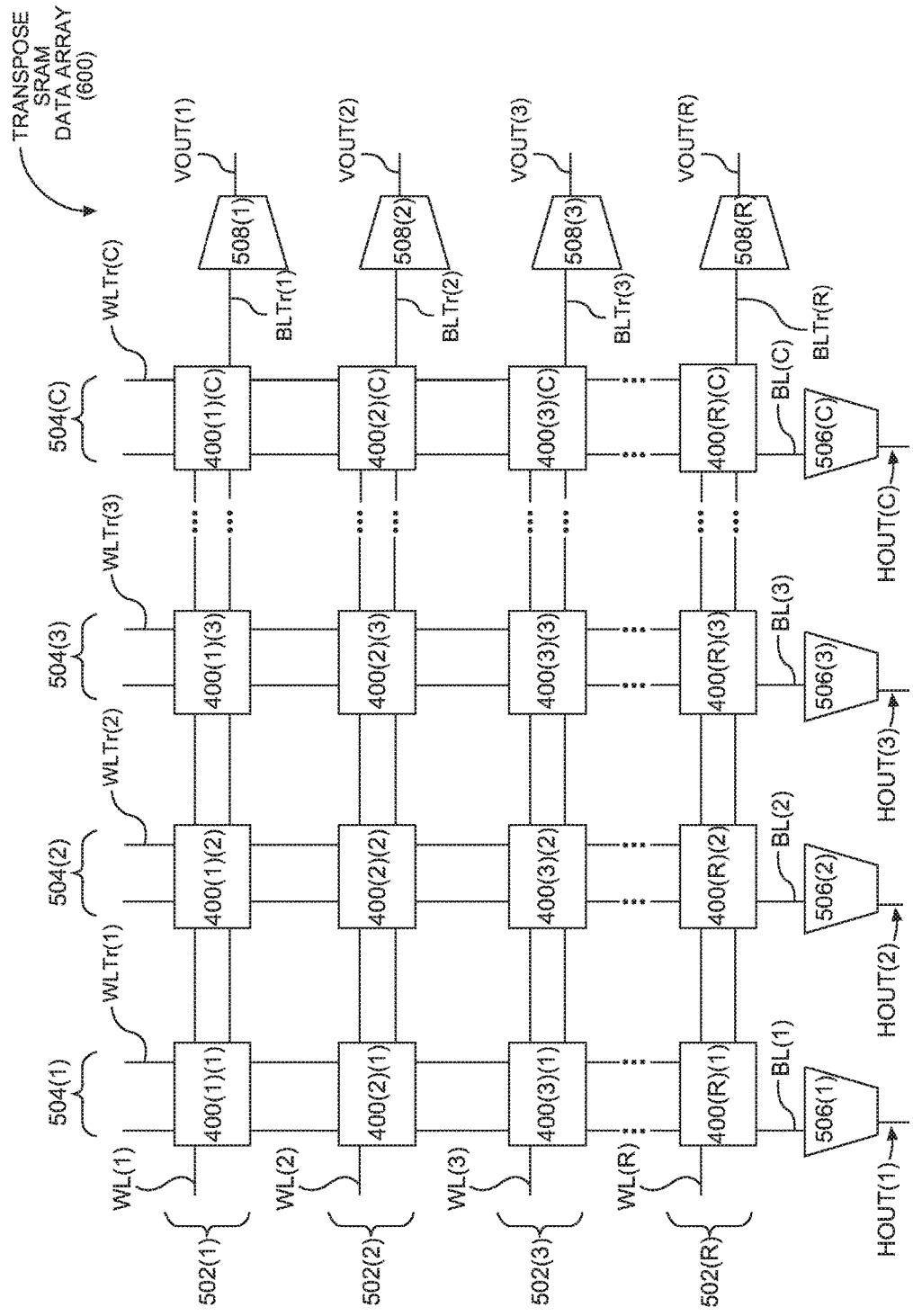
FIG. 6 is an exemplary transpose SRAM data array employing multiple six (6) transistor (6T) transpose SRAM bit cells of FIGS. 4A-4C and configured to perform horizontal and vertical read operations of the transpose SRAM bit cells.

FIG. 6 illustrates an exemplary transpose SRAM data array 600 employing multiple transpose SRAM bit cells 400(1)(1)-400(R)(C) of FIGS. 4A-4C and configured to perform horizontal and vertical read operations of the transpose SRAM bit cells 400(1)(1)-400(R)(C). The transpose SRAM data array 600 includes common elements with the transpose SRAM data array 500 of FIG. 5, which are referred to with common element numbers in FIG. 5 and FIG. 6, and thus will not be re-described herein.

With continuing reference to FIG. 6, similar to the transpose SRAM data array 500 in FIG. 5, the transpose SRAM data array 600 employs horizontal sense amplifiers 506(1)-506(C) and vertical sense amplifiers 508(1)-508(R). However, because the transpose SRAM bit cells 400(1)(1)-400(R)(C) do not employ complement bit lines BLB similar to the transpose SRAM bit cells 200(1)(1)-200(R)(C), each horizontal sense amplifier 506(1)-506(C) is configured to sense the data value indicated on each corresponding bit line BL(1)-BL(C), and generate a corresponding horizontal SRAM output value HOUT(1)-HOUT(C). Additionally, each vertical sense amplifier 508(1)-508(R) is configured to sense the data value indicated on each corresponding transpose bit line BLTr(1)-BLTr(R), and generate a corresponding vertical SRAM output value VOUT(1)-VOUT(R). It is worth noting that, similar to the transpose SRAM data array 500 in FIG. 5, a horizontal read operation and a vertical read operation may be performed either separately or concurrently on the transpose SRAM data array 600. In other words, an entire transpose SRAM row 502(1)-502(R) may be read at the same time as an entire transpose SRAM column 504(1)-504(C).

The elements described herein are sometimes referred to as means for performing particular functions. In this regard, the cross-coupled first and second inverters 202(1), 202(2) are sometimes referred to herein as "a means for storing a data value formed over a substrate." The horizontal read access transistor 206 is sometimes referred to herein as "a first means for accessing the data value." Additionally, the vertical read access transistor 224 is sometimes referred to herein as "a second means for accessing the data value." The word line WL is sometimes referred to herein as "a means for activating the first means for accessing the data value disposed in a first metal layer in a first direction." Further, the bit line BL is sometimes referred to herein as "a means for receiving the data value via the first means for accessing the data value disposed in a second metal layer in a second direction substantially orthogonal to the first direction." The transpose word line WLTr is sometimes referred to herein "a means for activating the second means for accessing the data value disposed in a third metal layer in the second direction." Additionally, the transpose bit line BLTr is sometimes referred to herein as "a means for receiving the data value via the second means for accessing the data value disposed in a fourth metal layer in the first direction."

Transpose SRAM bit cells configured for horizontal and vertical read operations according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 7:
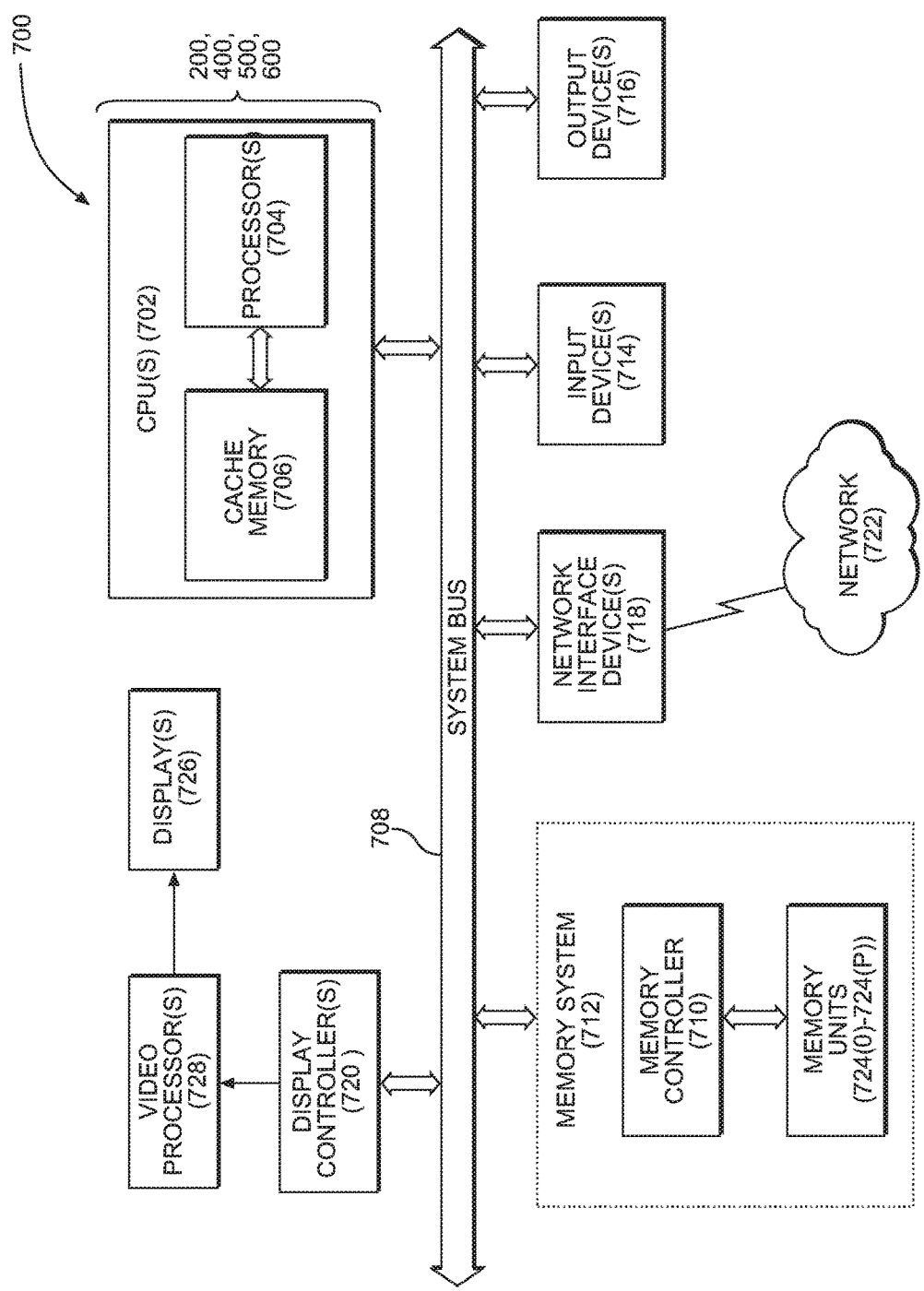
FIG. 7 is a block diagram of an exemplary processor-based system that can include elements employing the transpose SRAM bit cells of FIGS. 2A-2C and 4A-4C, and/or the transpose SRAM data arrays of FIGS. 5 and 6.

In this regard, FIG. 7 illustrates an example of a processor-based system 700 that can include elements employing the transpose SRAM bit cells 200, 400 of FIGS. 2A-2C and 4A-4C, respectively, and the transpose SRAM data arrays 500 and 600 of FIGS. 5 and 6, respectively. In this example, the processor-based system 700 includes one or more central processing units (CPUs) 702, each including one or more processors 704. The CPU(s) 702 may have cache memory 706 coupled to the processor(s) 704 for rapid access to temporarily stored data. The CPU(s) 702 is coupled to a system bus 708 and can intercouple master and slave devices included in the processor-based system 700. As is well known, the CPU(s) 702 communicates with these other devices by exchanging address, control, and data information over the system bus 708. For example, the CPU(s) 702 can communicate bus transaction requests to a memory controller 710 as an example of a slave device. Although not illustrated in FIG. 7, multiple system buses 708 could be provided, wherein each system bus 708 constitutes a different fabric.

Other master and slave devices can be connected to the system bus 708. As illustrated in FIG. 7, these devices can include a memory system 712, one or more input devices 714, one or more output devices 716, one or more network interface devices 718, and one or more display controllers 720, as examples. The input device(s) 714 can include any type of input device, including, but not limited to, input keys, switches, voice processors, etc. The output device(s) 716 can include any type of output device, including, but not limited to, audio, video, other visual indicators, etc. The network interface device(s) 718 can be any device configured to allow exchange of data to and from a network 722. The network 722 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 718 can be configured to support any type of communications protocol desired. The memory system 712 can include one or more memory units 724(0)-724(P).

The CPU(s) 702 may also be configured to access the display controller(s) 720 over the system bus 708 to control information sent to one or more displays 726. The display controller(s) 720 sends information to the display(s) 726 to be displayed via one or more video processors 728, which process the information to be displayed into a format suitable for the display(s) 726. The display(s) 726 can include any type of display, including, but not limited to, a cathode ray tube (CRT), a liquid crystal display (LCD), a plasma display, a light emitting diode (LED) display, etc.

Figure 8:
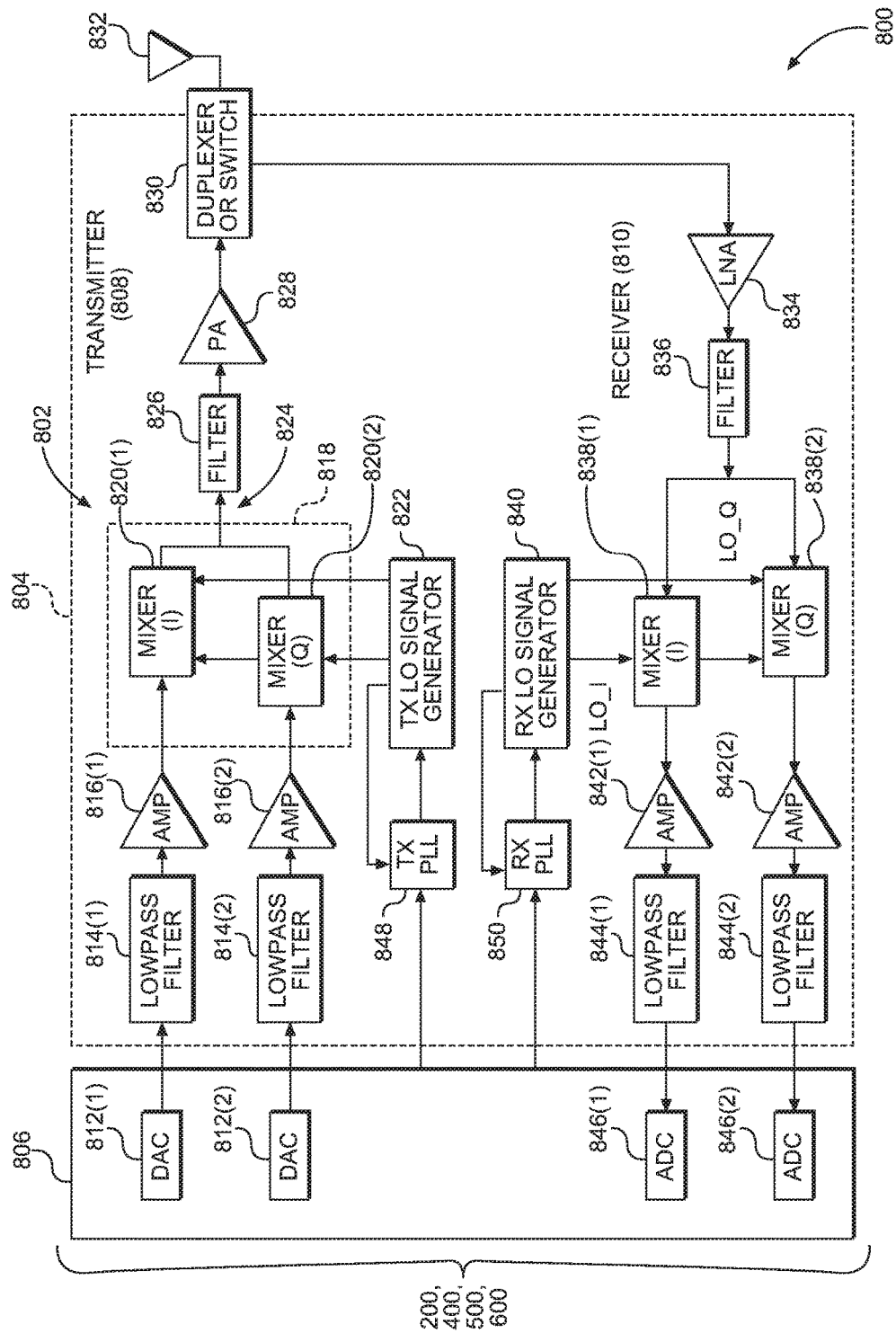
FIG. 8 is a block diagram of an exemplary wireless communications device that includes radio frequency (RF) components formed in an integrated circuit (IC), wherein the RF components can include elements employing the transpose SRAM bit cells of FIGS. 2A-2C and 4A-4C, and/or the transpose SRAM data arrays of FIGS. 5 and 6.

FIG. 8 illustrates an exemplary wireless communications device 800 that includes radio frequency (RF) components formed in an integrated circuit (IC) 802, wherein the RF components can include elements employing the transpose SRAM bit cells 200, 400 of FIGS. 2A-2C and 4A-4C, respectively, and the transpose SRAM data arrays 500 and 600 of FIGS. 5 and 6, respectively. In this regard, the wireless communications device 800 may be provided in the IC 802. The wireless communications device 800 may include or be provided in any of the above referenced devices, as examples. As shown in FIG. 8, the wireless communications device 800 includes a transceiver 804 and a data processor 806. The data processor 806 may include a memory to store data and program codes. The transceiver 804 includes a transmitter 808 and a receiver 810 that support bi-directional communications. In general, the wireless communications device 800 may include any number of transmitters 808 and/or receivers 810 for any number of communication systems and frequency bands. All or a portion of the transceiver 804 may be implemented on one or more analog ICs, RF ICs (RFICs), mixed-signal ICs, etc.

The transmitter 808 or the receiver 810 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 810. In the direct-conversion architecture, a signal is frequency-converted between RF and baseband in one stage. The super-heterodyne and direct-conversion architectures may use different circuit blocks and/or have different requirements. In the wireless communications device 800 in FIG. 8, the transmitter 808 and the receiver 810 are implemented with the direct-conversion architecture.

In the transmit path, the data processor 806 processes data to be transmitted and provides I and Q analog output signals to the transmitter 808. In the exemplary wireless communications device 800, the data processor 806 includes digital-to-analog converters (DACs) 812(1), 812(2) for converting digital signals generated by the data processor 806 into the I and Q analog output signals, e.g., I and Q output currents, for further processing.

Within the transmitter 808, lowpass filters 814(1), 814(2) filter the I and Q analog output signals, respectively, to remove undesired signals caused by the prior digital-to-analog conversion. Amplifiers (AMP) 816(1), 816(2) amplify the signals from the lowpass filters 814(1), 814(2), respectively, and provide I and Q baseband signals. An upconverter 818 upconverts the I and Q baseband signals with I and Q transmit (TX) local oscillator (LO) signals through mixers 820(1), 820(2) from a TX LO signal generator 822 to provide an upconverted signal 824. A filter 826 filters the upconverted signal 824 to remove undesired signals caused by the frequency upconversion as well as noise in a receive frequency band. A power amplifier (PA) 828 amplifies the upconverted signal 824 from the filter 826 to obtain the desired output power level and provides a transmit RF signal. The transmit RF signal is routed through a duplexer or switch 830 and transmitted via an antenna 832.

In the receive path, the antenna 832 receives signals transmitted by base stations and provides a received RF signal, which is routed through the duplexer or switch 830 and provided to a low noise amplifier (LNA) 834. The duplexer or switch 830 is designed to operate with a specific receive (RX)-to-TX duplexer frequency separation, such that RX signals are isolated from TX signals. The received RF signal is amplified by the LNA 834 and filtered by a filter 836 to obtain a desired RF input signal. Downconversion mixers 838(1), 838(2) mix the output of the filter 836 with I and Q RX LO signals (i.e., LO_I and LO_Q) from an RX LO signal generator 840 to generate I and Q baseband signals. The I and Q baseband signals are amplified by amplifiers (AMP) 842(1), 842(2) and further filtered by lowpass filters 844(1), 844(2) to obtain I and Q analog input signals, which are provided to the data processor 806. In this example, the data processor 806 includes ADCs 846(1), 846(2) for converting the analog input signals into digital signals to be further processed by the data processor 806.

In the wireless communications device 800 of FIG. 8, the TX LO signal generator 822 generates the I and Q TX LO signals used for frequency upconversion, while the RX LO signal generator 840 generates the I and Q RX LO signals used for frequency downconversion. Each LO signal is a periodic signal with a particular fundamental frequency. A TX phase-locked loop (PLL) circuit 848 receives timing information from the data processor 806 and generates a control signal used to adjust the frequency and/or phase of the TX LO signals from the TX LO signal generator 822. Similarly, an RX PLL circuit 850 receives timing information from the data processor 806 and generates a control signal used to adjust the frequency and/or phase of the RX LO signals from the RX LO signal generator 840.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A transpose static random access memory (SRAM) bit cell, comprising:
   a first inverter and a second inverter formed over a substrate and cross-coupled such that the first inverter and the second inverter are configured to store a data value;
   a horizontal read access transistor formed over the substrate and comprising:
      a first node electrically coupled to an output node of the first inverter;
      a second node; and
      a gate node;
   a vertical read access transistor formed over the substrate and comprising:
      a first node;
      a second node; and
      a gate node;
   a word line disposed in a first metal layer and having an axis disposed in a first direction, wherein the word line is electrically coupled to the gate node of the horizontal read access transistor;
   a bit line disposed in a second metal layer and having an axis disposed in a second direction substantially orthogonal to the first direction, wherein the bit line is electrically coupled to the second node of the horizontal read access transistor, wherein the bit line indicates the data value in response to a voltage applied to the word line activating the horizontal read access transistor;
   a transpose word line disposed in a third metal layer and having an axis disposed in the second direction, wherein the transpose word line is electrically coupled to the gate node of the vertical read access transistor; and
   a transpose bit line disposed in a fourth metal layer and having an axis disposed in the first direction, wherein the transpose bit line is electrically coupled to the second node of the vertical read access transistor, wherein the transpose bit line indicates the data value in response to a voltage applied to the transpose word line activating the vertical read access transistor;
   wherein the first node of the vertical read access transistor is electrically coupled to an output node of the second inverter.

2. The transpose SRAM bit cell of claim 1, wherein a complement of the data value is indicated on the transpose bit line in response to the voltage applied to the transpose word line activating the vertical read access transistor.

3. The transpose SRAM bit cell of claim 2, wherein:
   the horizontal read access transistor is an N-type metal-oxide semiconductor (MOS) (NMOS) transistor, wherein the first node is a drain node and the second node is a source node; and
   the vertical read access transistor is an NMOS transistor, wherein the first node is a drain node and the second node is a source node.

4. The transpose SRAM bit cell of claim 2, wherein:
   the first metal layer of the word line is a metal three (M3) layer;
   the third metal layer of the transpose word line is a metal two (M2) layer;
   the second metal layer of the bit line is the metal two (M2) layer; and
   the fourth metal layer of the transpose bit line is the metal three (M3) layer.

5. The transpose SRAM bit cell of claim 1 integrated into an integrated circuit (IC).

6. The transpose SRAM bit cell of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

7. A transpose static random access memory (SRAM) data array, comprising:
   a plurality of transpose SRAM bit cells organized into a plurality of transpose SRAM rows and a plurality of transpose SRAM columns, wherein each transpose SRAM bit cell of the plurality of transpose SRAM bit cells corresponds to a transpose SRAM row and a transpose SRAM column, and comprises:

a first inverter and a second inverter formed over a substrate and cross-coupled such that the first inverter and the second inverter are configured to store a data value;
a horizontal read access transistor formed over the substrate and comprising:
a first node electrically coupled to an output node of the first inverter;
a second node; and
a gate node; and
a vertical read access transistor formed over the substrate and comprising:
a first node;
a second node; and
a gate node;
a plurality of word lines, wherein each word line is disposed in a first metal layer, has an axis disposed in a first direction, and is electrically coupled to the gate node of the horizontal read access transistor of each transpose SRAM bit cell of a corresponding transpose SRAM row;
a plurality of bit lines, wherein:
each bit line is disposed in a second metal layer, has an axis disposed in a second direction substantially orthogonal to the first direction, and is electrically coupled to the second node of the horizontal read access transistor of each transpose SRAM bit cell of a corresponding transpose SRAM column; and
in response to a voltage applied to a word line of the plurality of word lines activating the horizontal read access transistor in each transpose SRAM bit cell in a first transpose SRAM row in a horizontal read operation, the data value stored in a transpose SRAM bit cell corresponding to the first transpose SRAM row and in the corresponding transpose SRAM column is indicated on the bit line;
a plurality of transpose word lines, wherein each transpose word line is disposed in a third metal layer, has an axis disposed in the second direction, and is electrically coupled to the gate node of the vertical read access transistor of each transpose SRAM bit cell of a corresponding transpose SRAM column;
a plurality of transpose bit lines, wherein:
each transpose bit line is disposed in a fourth metal layer, has an axis disposed in the first direction, and is electrically coupled to the second node of the vertical read access transistor of each transpose SRAM bit cell of a corresponding transpose SRAM row; and
in response to a voltage applied to a transpose word line of the plurality of transpose word lines activating the vertical read access transistor in each transpose SRAM bit cell in a first transpose SRAM column in a vertical read operation, the data value stored in a transpose SRAM bit cell corresponding to the first transpose SRAM column and in the corresponding transpose SRAM row is indicated on the transpose bit line;
a plurality of horizontal sense amplifiers, wherein each horizontal sense amplifier of the plurality of horizontal sense amplifiers is electrically coupled to the bit line of a corresponding transpose SRAM column, and configured to sense the data value indicated on the bit line corresponding to the transpose SRAM column, the plurality of horizontal sense amplifiers configured to generate a horizontal output data value comprising the data values stored in the SRAM bit cells in the first transpose SRAM row in response to the horizontal read operation; and
a plurality of vertical sense amplifiers, wherein each vertical sense amplifier of the plurality of vertical sense amplifiers is electrically coupled to the transpose bit line of a corresponding transpose SRAM row, and configured to sense the data value indicated on the transpose bit line corresponding to the transpose SRAM row, the plurality of vertical sense amplifiers configured to generate a vertical output data value comprising the data values stored in the transpose SRAM bit cells in the first transpose SRAM column in response to the vertical read operation.

8. The transpose SRAM data array of claim 7, further comprising:
a plurality of complement bit lines, wherein each complement bit line is disposed in a fifth metal layer and has an axis disposed in the second direction;
each transpose SRAM bit cell of the plurality of transpose SRAM bit cells further comprises a second horizontal read access transistor formed over the substrate and comprising:
a first node electrically coupled to an output node of the second inverter;
a second node electrically coupled to the complement bit line of the corresponding transpose SRAM column; and
a gate node electrically coupled to the word line; and
each transpose SRAM bit cell of the plurality of transpose SRAM bit cells further comprises a second vertical read access transistor formed over the substrate and comprising:
a first node electrically coupled to a ground source;
a second node electrically coupled to first node of the vertical read access transistor; and
a gate node electrically coupled to the output node of the second inverter.

9. The transpose SRAM data array of claim 8, wherein:
the horizontal read access transistor of each transpose SRAM bit cell is an N-type metal-oxide semiconductor (MOS) (NMOS) transistor, wherein the first node is a drain node and the second node is a source node;
the vertical read access transistor of each transpose SRAM bit cell is an NMOS transistor, wherein the first node is a drain node and the second node is a source node;
the second horizontal read access transistor of each transpose SRAM bit cell is an NMOS transistor, wherein the first node is a drain node and the second node is a source node; and
the second vertical read access transistor of each transpose SRAM bit cell is an NMOS transistor, wherein the first node is a drain node and the second node is a source node.

10. The transpose SRAM data array of claim 8, wherein:
the first metal layer of the word line is a metal two (M2) layer;
the third metal layer of the transpose word line is a metal three (M3) layer;
the second metal layer of the bit line is the metal three (M3) layer;
the fifth metal layer of the complement bit line is the metal three (M3) layer; and
the fourth metal layer of the transpose bit line is a metal four (M4) layer.

11. The transpose SRAM data array of claim 7, wherein the first node of the vertical read access transistor of each transpose SRAM bit cell is electrically coupled to an output node of the corresponding second inverter.

12. The transpose SRAM data array of claim 7, wherein a complement of the data value of each transpose SRAM bit cell of the plurality of transpose SRAM bit cells is indicated on the corresponding transpose bit line in response to a voltage applied to the transpose word line activating the corresponding vertical read access transistor.

13. The transpose SRAM data array of claim 12, wherein:
the horizontal read access transistor of each transpose SRAM bit cell is an NMOS transistor, wherein the first node is a drain node and the second node is a source node; and
the vertical read access transistor of each transpose SRAM bit cell is an NMOS transistor, wherein the first node is a drain node and the second node is a source node.

14. The transpose SRAM data array of claim 12, wherein:
the first metal layer of the word line is a metal three (M3) layer;
the third metal layer of the transpose word line is a metal two (M2) layer;
the second metal layer of the bit line is the metal two (M2) layer; and
the fourth metal layer of the transpose bit line is the metal three (M3) layer.

15. The transpose SRAM data array of claim 7 integrated into an integrated circuit (IC).

16. The transpose SRAM data array of claim 7 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

17. A method of performing a vertical read operation and a horizontal read operation on a transpose static random access memory (SRAM) data array, comprising:
applying a voltage to a word line of a plurality of word lines in a transpose SRAM data array, wherein each word line of the plurality of word lines:
is disposed in a first metal layer;
has an axis disposed in a first direction; and
is electrically coupled to a gate node of a horizontal read access transistor of each transpose SRAM bit cell in a corresponding transpose SRAM row, the horizontal read access transistor configured to access a data value stored by a first inverter cross-coupled with a second inverter;
responsive to a horizontal read operation:
applying the voltage to the word line of the plurality of word lines; and
sensing a voltage on a bit line of a plurality of bit lines in the transpose SRAM data array, wherein each bit line of the plurality of bit lines:
is disposed in a second metal layer;
has an axis disposed in a second direction substantially orthogonal to the first direction; and
is electrically coupled to a second node of the horizontal read access transistor of each transpose SRAM bit cell in a corresponding transpose SRAM column; and
generating a horizontal output data value comprising the data values stored in the transpose SRAM bit cells in the transpose SRAM row corresponding to the word line of the plurality of word lines;
applying a voltage to a transpose word line of a plurality of transpose word lines in the transpose SRAM data array, wherein each transpose word line of the plurality of transpose word lines:
is disposed in a third metal layer;
has an axis disposed in the second direction; and
is electrically coupled to a gate node of a vertical read access transistor of each transpose SRAM bit cell in a corresponding transpose SRAM column, the vertical read access transistor configured to access the data value stored by the first inverter cross-coupled with the second inverter; and
responsive to a vertical read operation:
applying the voltage to the transpose word line of the plurality of transpose word lines;
sensing a voltage on a transpose bit line of a plurality of transpose bit lines in the transpose SRAM data array, wherein each transpose bit line of the plurality of transpose bit lines:
is disposed in a fourth metal layer;
has an axis disposed in the first direction; and
is electrically coupled to a second node of the vertical read access transistor of each transpose SRAM bit cell in a corresponding transpose SRAM row; and
generating a vertical output data value comprising the data values stored in the transpose SRAM bit cells in the transpose SRAM column corresponding to the transpose word line of the plurality of transpose word lines.

18. The method of claim 17, wherein generating the vertical output data value further comprises generating the vertical output data value comprising complement data values stored in the transpose SRAM bit cells.

19. The method of claim 17, wherein a first node of the vertical read access transistor of each transpose SRAM bit cell is electrically coupled to an output node of the second inverter in the transpose SRAM bit cell.

* * * * *